United States Patent [19]

Kikuchi

[11] Patent Number: 5,687,125

[45] Date of Patent: Nov. 11, 1997

[54] SEMICONDUCTOR MEMORY DEVICE HAVING REDUNDANCY MEMORY CELLS INCORPORATED INTO SUB MEMORY CELL BLOCKS

[75] Inventor: Wataru Kikuchi, Tokyo, Japan

[73] Assignee: NEC Corporation, Tokyo, Japan

[21] Appl. No.: 755,366

[22] Filed: Nov. 25, 1996

[30] Foreign Application Priority Data

Nov. 24, 1995 [JP] Japan .................... 7-305334

[51] Int. Cl.$^6$ .................................. G11C 7/00
[52] U.S. Cl. .............. 365/200; 365/225.7; 365/230.02
[58] Field of Search .......................... 365/200, 225.7, 365/230.02; 371/101, 10.2

[56] References Cited

U.S. PATENT DOCUMENTS

| 5,504,712 | 4/1996 | Conan | 365/200 |
| 5,506,807 | 4/1996 | Ferrant et al. | 365/200 |

Primary Examiner—David C. Nelms
Assistant Examiner—Vu A. Le
Attorney, Agent, or Firm—Foley & Lardner

[57] ABSTRACT

In a semiconductor memory device including first and second sub blocks each having a normal memory cell array and at least one redundancy memory cell row, and first and second sub block selecting circuits for selecting the first and second sub blocks, a multiplexer is connected between the first and second sub block selecting circuits and the first and second sub blocks, and redundancy memory cell row exchanging circuits for the redundancy memory cell rows are provided. The multiplexer is controlled in accordance with the output signals of the redundancy memory cell row exchanging circuits and the block selecting circuits, and the selection of the redundancy memory cell rows.

9 Claims, 5 Drawing Sheets

SEMICONDUCTOR MEMORY DEVICE HAVING REDUNDANCY MEMORY CELLS INCORPORATED INTO SUB MEMORY CELL BLOCKS

FIELD OF THE INVENTION

The present invention relates to a semiconductor memory device, and more particularly, to a semiconductor memory device having a plurality of sub memory cell blocks each including a normal memory cell array and at least one redundancy memory cell row.

DESCRIPTION OF THE RELATED ART

As semiconductor memory devices such as dynamic random memory (DRAM) devices have become more refined, the capacity of individual memory cells has been decreased, the resistance of connections has been increased, and the capacitance between the connections has also been increased. Also, as the chip size of the devices has been increased, the reduction of voltage at the connections has been increased. Thus, the operation speed of the devices has been decreased, and also the signal to noise (S/N) ratio has been decreased.

Particularly, in DRAM devices, leakage currents flowing between capacitors for storing information and a substrate which form PN junctions affect the memory retention. Also, the leakage currents depend upon the temperature of the substrate. For example, the leakage currents are increased a thousand times when the temperature of the substrate is increased by 100° C. In order to increase the memory retention, the power needs to be reduced to decrease the temperature of the substrate.

In order to increase the operation speed, the S/N ratio and the memory retention, in a prior art semiconductor memory device, memory cells are divided into a plurality of sub memory cell blocks. Then, only one of the sub memory cell blocks is selected and operated.

On the other hand, one or more redundancy memory cell rows (or columns) are incorporated in normal memory cells of a semiconductor memory device. Therefore, if a defective memory cell is found in the normal memory cells, the defective memory cell is replaced by a redundancy memory cell of the redundancy memory cell rows and is alleviated.

In the above-mentioned prior art semiconductor memory device, such redundancy memory cell rows are individually allocated to each of the sub memory cell blocks. This will be explained later in detail.

In the above-mentioned prior art semiconductor memory device, however, if a defective memory cell is found in one of the sub memory cell blocks, such a defective memory cell cannot be replaced by a redundancy memory cell allocated to another of the sub memory cell blocks. Therefore, if a relatively large number of defective memory cells are found and concentrated in one of the sub memory cell blocks, it is impossible to alleviate all the defective memory cells, in spite of other redundancy memory cells allocated to the other sub memory cell blocks not being used.

Note that, if a large number of redundancy memory cell rows are allocated to each of the sub memory cell blocks, a large number of defective memory cells concentrated on one of the sub memory cell blocks may be alleviated. In this case, however, the device is increased in size, which reduces the manufacturing yield.

SUMMARY OF THE INVENTION

It is an object of the present invention to increase the manufacturing yield of a semiconductor memory device having redundancy memory cells incorporated into sub memory cell blocks.

According to the present invention, in a semiconductor memory device including first and second sub blocks each having a normal memory cell array and at least one redundancy memory cell row, and first and second sub selecting circuits for selecting the first and second sub blocks, a multiplexer is connected between the first and second sub memory cell block selecting circuits and the first and second sub memory cell blocks, and redundancy memory cell row exchanging circuits for the redundancy memory cell rows are provided. The multiplexer is controlled in accordance with the output signals of the redundancy memory cell row exchanging circuits and the block selecting circuits, and the selection of the redundancy memory cell rows. That is, when the first redundancy row exchanging circuit generates a first exchange signal and the redundancy memory cell row of the first sub memory cell block is selected, or when the second redundancy row exchanging circuit generates a second exchange signal and the redundancy memory cell row of the second sub memory cell block is selected, the multiplexer is operated so that the first and second sub memory cell block selecting circuits select the second and first memory cell blocks, respectively. Otherwise, the multiplexer is operated so that the first and second sub memory cell block selecting circuits select the first and second memory cell blocks, respectively.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, a prior art semiconductor memory device will be explained with reference to FIGS. 1 and 2.

Figure 1:
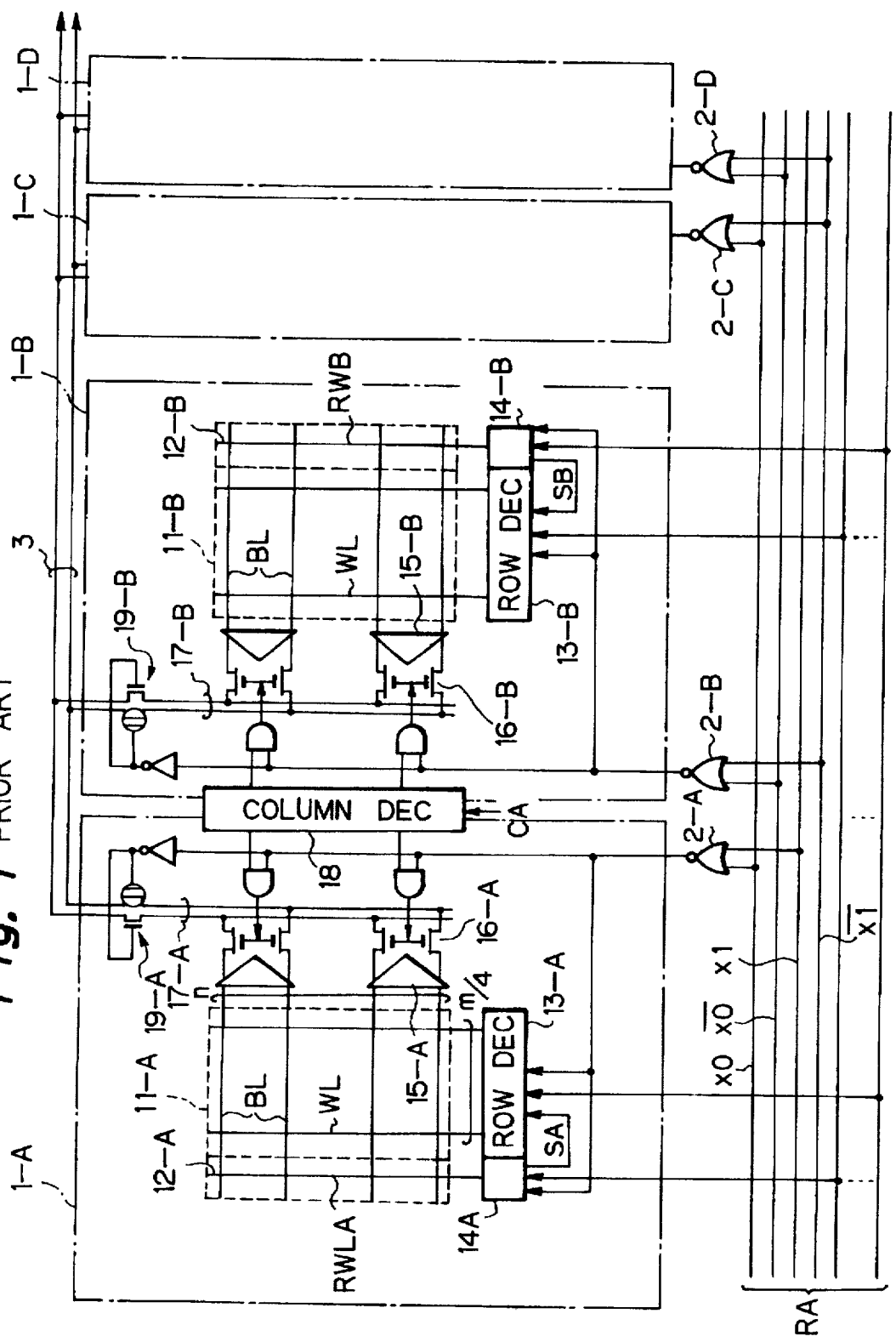
FIG. 1 is a circuit diagram illustrating a prior art semiconductor memory device.

In FIG. 1, an m rows×n columns DRAM device is illustrated. That is, four blocks 1A, 1B, 1C and 1D having the same configuration are provided and are selected by block selecting circuits 2-A, 2-B, 2-C and 2-D, respectively, which decode two row address signals x0 and x1 and their inverted signals of a row address RA. The blocks 1-A, 1-B, 1-C and 1D are commonly connected to an input/output line 3. Thus, when the row address RA is supplied to the device, the two bits x0 and x1 and their inverted signals of the row address RA are supplied to the block selecting circuits 2-A, 2-B, 2-C and 2-D, so that one only block is operated to increase the operation speed, the S/N ratio and the memory retention.

One of the blocks such as 1-A is explained next.

A normal memory cell array 11A includes memory cells (not shown) at intersections between m/4 word lines WL and n pairs of bit lines. Also, a redundancy memory cell row 12-A includes memory cells (not shown) at intersections between a redundancy word line RWLA and the n pairs of bit lines BL.

One of the word lines WL is selected by a normal row decoder 13-A which receives the row address RA. Also, the redundancy word line RWL is selected by a redundancy row decoder 14-A. In this case, when the redundancy row decoder 14-A selects the redundancy word line RWL, the redundancy row decoder 14-A generates a disable signal SA and transmits it to the normal row decoder 13-A. Thus, one of the word lines WL is replaced by the redundancy word line RWL.

The bit lines BL are connected to sense amplifiers 15-A, and the sense amplifiers 15-A are connected via column selection switches 16-A to a sub input/output line 17-A. One of the column selection switches 16-A is selected and turned ON by a column decoder 18 which receives a column address CA. Also, the sub input/output line 17-A is connected via a block selection switch 19-A controlled by the block selecting circuit 2-A.

Note that the column decoder 18 is shared by the two blocks 1-A and 1-B.

Thus, data sensed by one of the sense amplifiers 15-A is transmitted via one of the column switching transistors 16-A and the sub input/output line 17-A to the input/output line 3. The data is further amplified by an amplifier (not shown) and is output from an input/output circuit (not shown).

Figure 2:
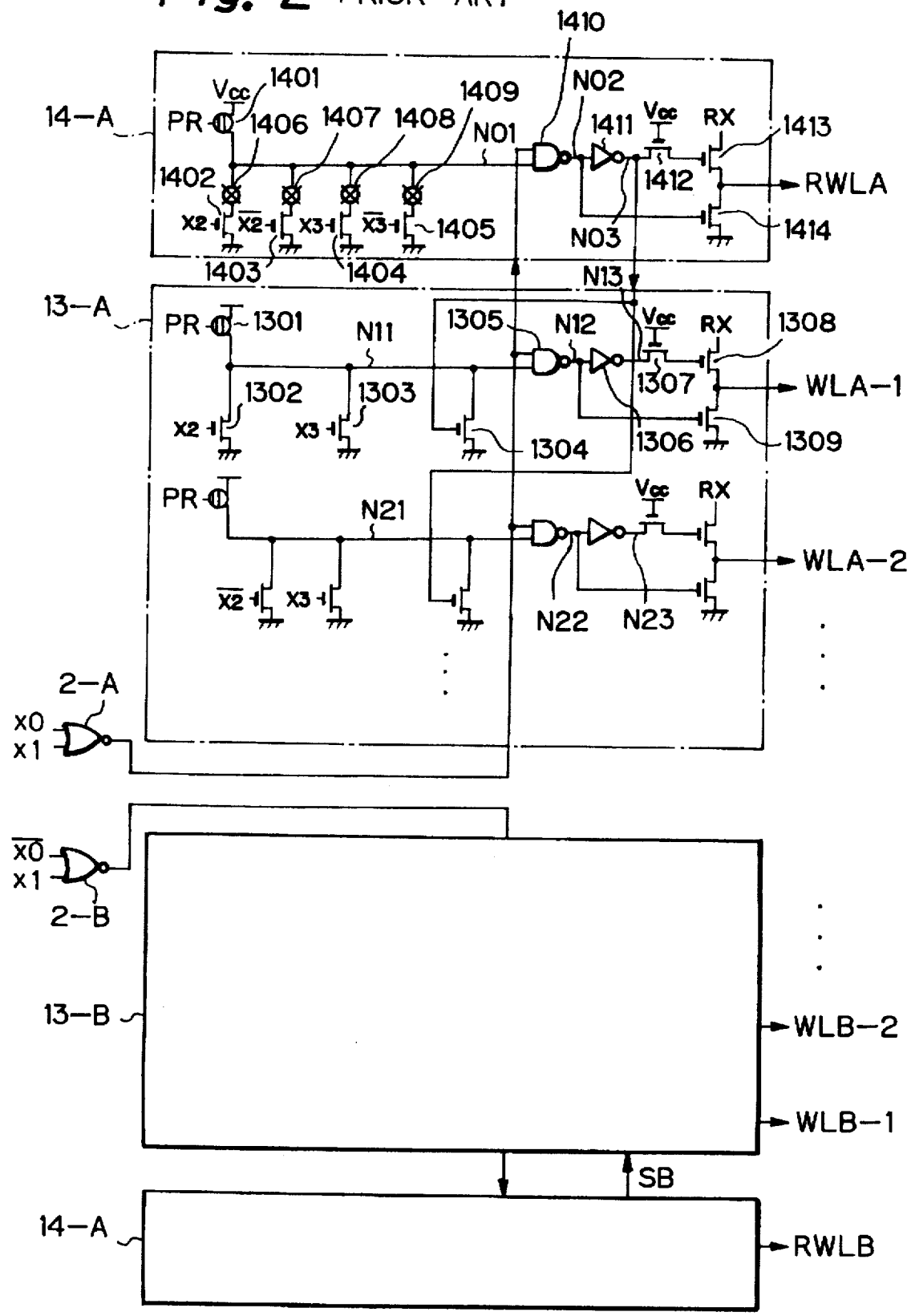
FIG. 2 is a detailed circuit diagram of the normal row decoder and the redundancy row decoder of FIG. 1.

In FIG. 2, which is a detailed circuit diagram of the normal row decoder 13-A and the redundancy row decoder 14-A, two row address signals x2 and x3 and their inverted signals are supplied, and the other row address signals are omitted for simplifying the description. The normal row decoder 13-A for one word line such as WLA-1 includes a precharging transistor 1301, switching transistors 1302 and 1303 for the row address signals x2 and x3, a disabling transistor 1304 turned ON by the disable signal SA from the redundancy decoder 14-A, a NAND circuit 1305 controlled by the block selecting circuit 2-A, an inverter 1106, a transistor 1307, and an inverter formed by transistors 1308 and 1309 driven by a row driving signal RX. Similarly, the normal row decoder 14-A for the redundancy word line RWLA includes a precharging transistor 1401, switching transistors 1402 and 1405 for the row address signals x2 and x3 and their inverted signals, fuses 1406 to 1409 connected to the switching transistors 1402 to 1405, respectively, a NAND circuit 1410 controlled by the block selecting circuit 2-A, an inverter 1411, a transistor 1412, an inverter formed by transistors 1413 and 1414 driven by a row driving signal RX.

Assume that no defective memory cells are found in the normal memory cell array 11-A (see FIG. 1), and therefore, none of the fuses 1402 to 1405 are melted. In this case, the selecting operation for the word line WLA-1 is as follows. First, during a precharging period, the precharging transistors such as 1301 and 1401 are turned ON by a precharging signal PR, so that voltages at nodes N01, N11 and N21 are at a high level (=$V_{cc}$). Then, the precharging transistors are turned OFF. Next, the row address signals x0, x1, x2 and x3 (=0, 0, 0 and 0) are supplied to all the block selecting circuits and all the row decoders. As a result, only the voltage at node N11 remains high, while the voltages at the other nodes such as N01 and N21 are pulled down to the ground level.

Therefore, only the voltage at node N12 remains low, while the voltages at the other nodes such as N02 and N22 are pulled up to $V_{cc}$. Also, only the voltage at node N13 remains high, while the voltages at the other nodes such as N03 and N23 are pulled down to the ground level. That is, since the voltage at node N03 is at the ground level, the disable signal SA is low, so that the normal row decoder 13A is not disabled. In this state, when the row drive signal RX is made high, the word line WLA-1 is selected.

Next, assume that a defective memory cell is found in the normal memory cell array 11-A (see FIG. 1), and such a defective memory cell is connected to the word line WLA-1. In this case, the fuses 1406 and 1408 are melted down by a laser trimming method or the like, to replace the word line WLA-1 by the redundancy word line RWLA. The selecting operation for the redundancy word line RWLA is as follows. First, during a precharging period, the precharging transistor, such as 1301 and 1401 are turned ON by the precharging signal PR, so that the voltages at nodes N01, N11 and N21 are at a high level (=$V_{cc}$). Then, the precharging transistors are turned OFF. Next, the row address signals x0, x1, x2 and x3 (=0, 0, 0 and 0) are supplied to all the block selecting circuits and all the row decoders. As a result, the voltage at nodes N01 and N11 remains high, while the voltages at the other nodes such as N21 are pulled down to the ground level. In this case, however, since the voltages at nodes N02 and N03 are low and high, respectively, the transistor 1304 is turned by the voltage at node N03, i.e., the disable signal SA, so that the voltage at node N11 is also pulled down to the ground level. Therefore, only the voltage at node N02 remains low, while the voltages at the other nodes such as N12 and N22 are pulled up to $V_{cc}$. Also, only the voltage at node N03 remains high, while the voltages at the other nodes such as N013 and N23 are pulled down to the ground level. In this state, when the row drive signal RX is made high, the redundancy word line RWLA is selected instead of the word line WLA-1.

Further, assume that defective memory cells are found in the normal memory cell array 11-A (see FIG. 1), and such defective memory cells are connected to the word lines WLA-1 and WLA-2. In this case, although the fuses 1406 and 1408 are melted down by a laser trimming method or the like, to replace the word line WLA-1 by the redundancy word line RWLA, it is impossible to replace the word line WLA-2 by the redundancy word line RWLB, since the redundancy word line RWLB is allocated to only the block 1-B.

Figure 3:
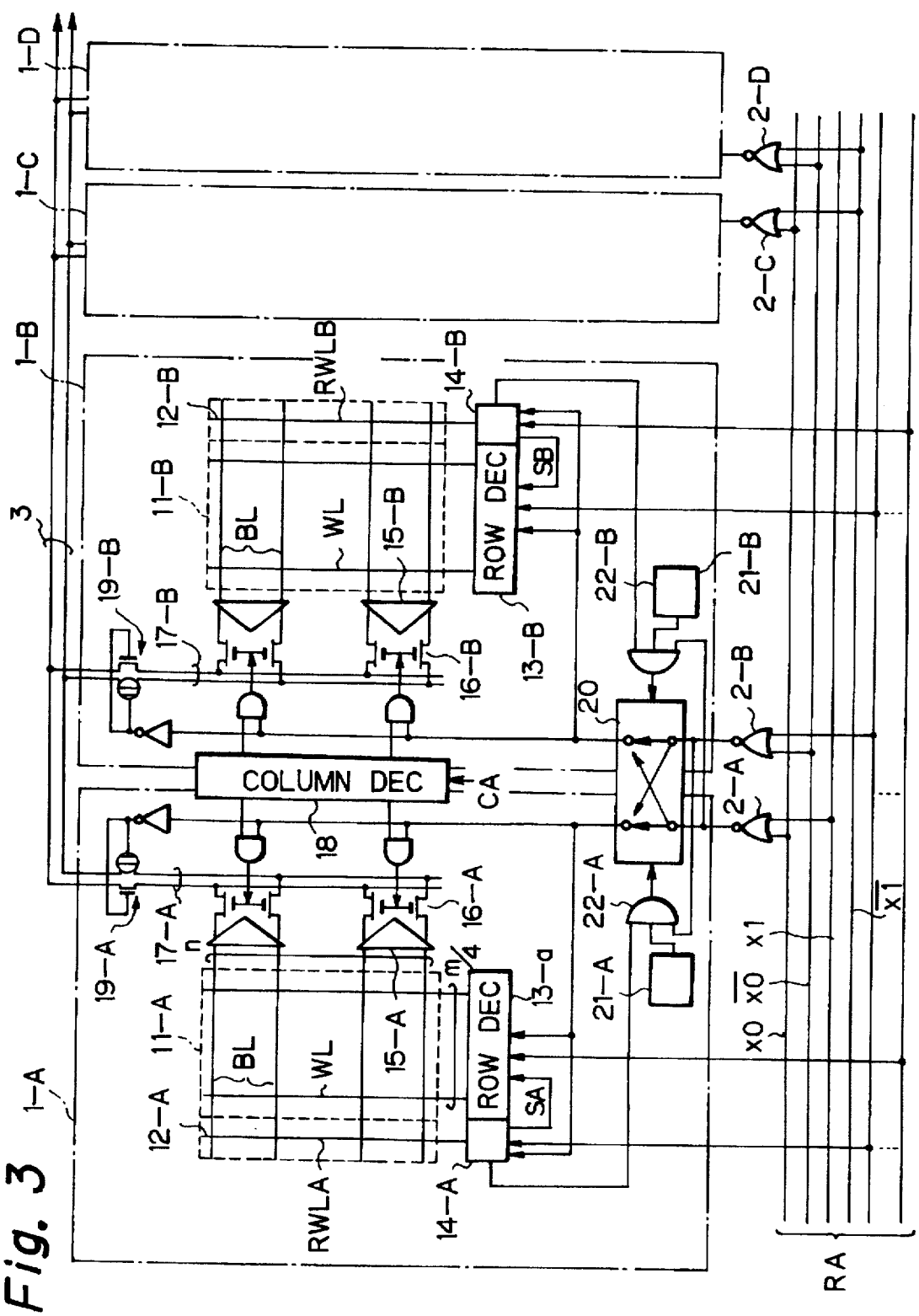
FIG. 3 is a circuit diagram illustrating an embodiment of the semiconductor memory device according to the present invention.

In FIG. 3, which illustrates an embodiment of the present invention, a multiplexer 20 is provided commonly for the blocks 1-A and 1-B of FIG. 1. Also, a redundancy memory cell exchanging circuit 21-A and an AND circuit 22-A are added to the elements of the block 1-A of FIG. 1, and a redundancy memory cell exchanging circuit 21-B and an AND circuit 22-B are added to the elements of the block 1-B of FIG. 1.

When the multiplexer 20 is in a first operation state, the block selecting circuits 2-A and 2-B select the blocks 1-A and 1-B, respectively, in the same way as in the device of FIG. 1. On the other hand, when the multiplexer 20 is in a second operation state, the block selecting circuits 2-A and 2-B select the blocks 1-B and 1-A, respectively. The first and second operation states of the multiplexer 20 is controlled by the output signals of the AND circuits 22-A and 22-B.

That is, when the redundancy memory cell exchanging circuit 2-A generates an exchange signal, the block selecting circuit 2-B generates a selection signal and the redundancy row decoder 14-A selects the redundancy word line RWLA, the multiplexer 20 is switched to the second operation state, so that one of the word lines of the block 1-B connected to a defective memory cell is replaced by the redundancy word line RWLA. Thus, such as defective memory cell is alleviated.

On the other hand, when the redundancy memory cell exchanging circuit 2-B generates an exchange signal, the block selecting circuit 2-A generates a selection signal and the redundancy row decoder 14-B selects the redundancy word line RWLB, the multiplexer 20 is also switched to the second operation state, so that one of the word lines of the block 1-A connected to a defective memory cell is replaced by the redundancy word line RWLB. Thus, such a defective memory cell is alleviated.

Note that, if the redundancy memory cell row exchanging circuits 21-A and 21-B do not generate exchange signals, the device of FIG. 3 operates in the same way as in the device of FIG. 1.

Figure 4:
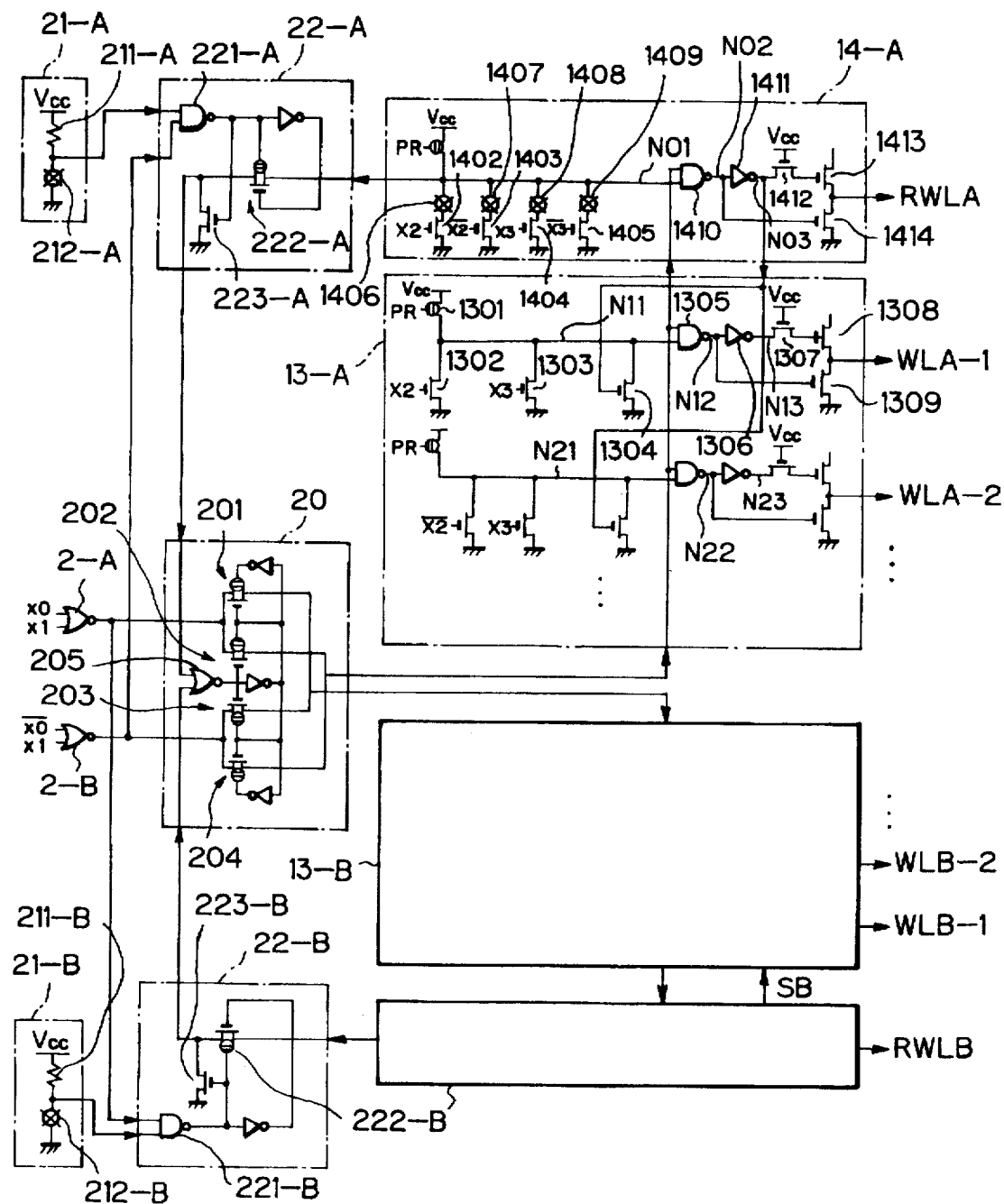
FIG. 4 is a detailed circuit diagram of the normal row decoders, the redundancy row decoders, the multiplexer, the redundancy memory cell row exchanging circuits, the AND circuits and the NOR circuit of FIG. 3.

FIG. 4 is a detailed circuit diagram of the multiplexer 20, the redundancy memory cell row exchanging circuits 21-A and 21-B and the AND circuits 22-A and 22-B of FIG. 3 as well as the normal row decoders and the redundancy row decoders.

The multiplexer 20 includes four transfer gates 201, 202, 203 and 204. When the output signals of the AND circuits 22-A and 22-B are both low, the transfer gates 202 and 203 are turned ON, while the transfer gates 201 and 204 are turned OFF. As a result, the block selecting circuit 2-A selects the normal row decoder 13-A and the redundancy row decoder 14-A, and the block selecting circuit 2-B selects the normal row decoder 13-B and the redundancy row decoder 14-B. On the other hand, when at least one of the output signals of the AND circuits 22-A and 22-B is high, the transfer gates 201 and 204 are turned ON, while the transfer gates 202 and 203 are turned OFF. As a result, the block selecting circuit 2-A selects the normal row decoder 13-B and the redundancy row decoder 14-B, and the block selecting circuit 2-B selects the normal row decoder 13-A and the redundancy row decoder 14-A.

Also, each of the redundancy memory cell row exchanging circuits 21-A and 21-B includes a resistor 211-A (211-B) and a fuse 212-A (212-B) connected in series between the power supply $V_{cc}$ and the ground level. For example, in the redundancy memory cell row exchanging circuit 21-A, when the fuse 212-A is not melted, the output voltage is at the ground level, which means that an exchange signal is not generated. On the other hand, when the fuse 212-A is melted down, the output voltage is at $V_{cc}$, which means that an exchange signal is generated.

Further, each of the AND circuits 22-A and 22-B includes a NANDgate 221-A (221-B) for receiving the output signals of the redundancy memory cell row exchanging circuit 21-A (21-B) and the block selecting circuit 2-B (2-A), a transfer gate 222-A (222-B) controlled by the output signal of the NAND gate 221-A (221-B) for transferring the voltage at node N01 of the redundancy row decoder 14-A (14-B) and a transistor 223-A (223-B) controlled by the output signal of the NAND circuit 221-A (221-B). That is, the output signal of the AND circuit 22-A (22-B) is an AND logic of its three input signals.

The operation of the circuit of FIG. 4 is explained next.

Assume that no defective memory cells are found in the normal memory cell array 11-A (see FIG. 3), and therefore, none of the fuses 1402 to 1405, 212-A and 212-B are melted. In this case, the selecting operation for the word line WLA-1 is the same as in the circuit of FIG. 2.

Next, assume that a defective memory cell is found in the normal memory cell array 11-A (see FIG. 3), and such a defective memory cell is connected to the word line WLA-1. In this case, the fuses 1406 and 1408 are melted down by a laser trimming method or the like; however, the fuses 212-A and 212-B are not melted, thus replacing the word line WLA-1 by the redundancy word line RWLA. The selecting operation for the redundancy word line RWLA is also the same as in the circuit of FIG. 2.

Further, assume that defective memory cells are found in the normal memory cell array 11-B (see FIG. 3), and such defective memory cells are connected to the word lines WLB-1 and WLB-2. In this case, the fuses 1406 and 1408 of the redundancy row decoder 14-B are melted down by a laser trimming method or the like, to replace the word line WLB-1 by the redundancy word line RWLB. In addition, the fuses 1406 and 1408 of the redundancy row decoder 14-A and the fuse 212-A of the redundancy memory cell row exchanging circuit 21-A are melted down.

The selecting operation for the redundancy word line RWLB is a similar way to that of the circuit of FIG. 2, thus replacing the word line WLB-1 by the redundancy word line RWLB.

The selecting operation for the redundancy word line RWLB is explained below.

First, during a precharging period, the precharging transistors such as 1301 and 1401 are turned ON by the precharging signal PR, so that the voltages at nodes N01, N11 and N21 are at a high level (=$V_{cc}$). Then, the precharging transistors are turned OFF. Next, the row address signals x0, x1, x2 and x3 (=1, 0, 1 and 0) are supplied to all the block selecting circuits and all the row decoders. As a result, the voltage at nodes N01 and N21 remains high, while the voltages at the other nodes such as N11 are pulled down to the ground level. In this case, since the output signals of the redundancy cell row exchanging circuit 21-A and the block selecting circuit 2-B are both high, the output signal of the AND circuit 22-A is high. Therefore, the multiplexer 20 is switched from the first operation mode to the second operation mode. As a result, the voltages at nodes N02 and N03 are low and high, respectively. Therefore, the transistor 1304 is turned OFF by the voltage at node N03, i.e., the disable signal SA, so that the voltage at node N21 is also pulled down to the ground level. Therefore, only the voltage at node N02 remains low, while the voltages at the other nodes such as N12 and N22 are pulled up to $V_{cc}$, and only the voltage at node N03 remains high, while the voltages at the other nodes such as N13 and N23 are pulled down to the ground level. In this state, when the row drive signal RX is made high, the redundancy word line RWLA is selected instead of the word line WLB-2. Thus, it is possible to replace the word line WLB-2 of the block 1-B by the redundancy word line RWLA, even if the redundancy word line RWLA is allocated to only the block 1-A.

Figure 5:
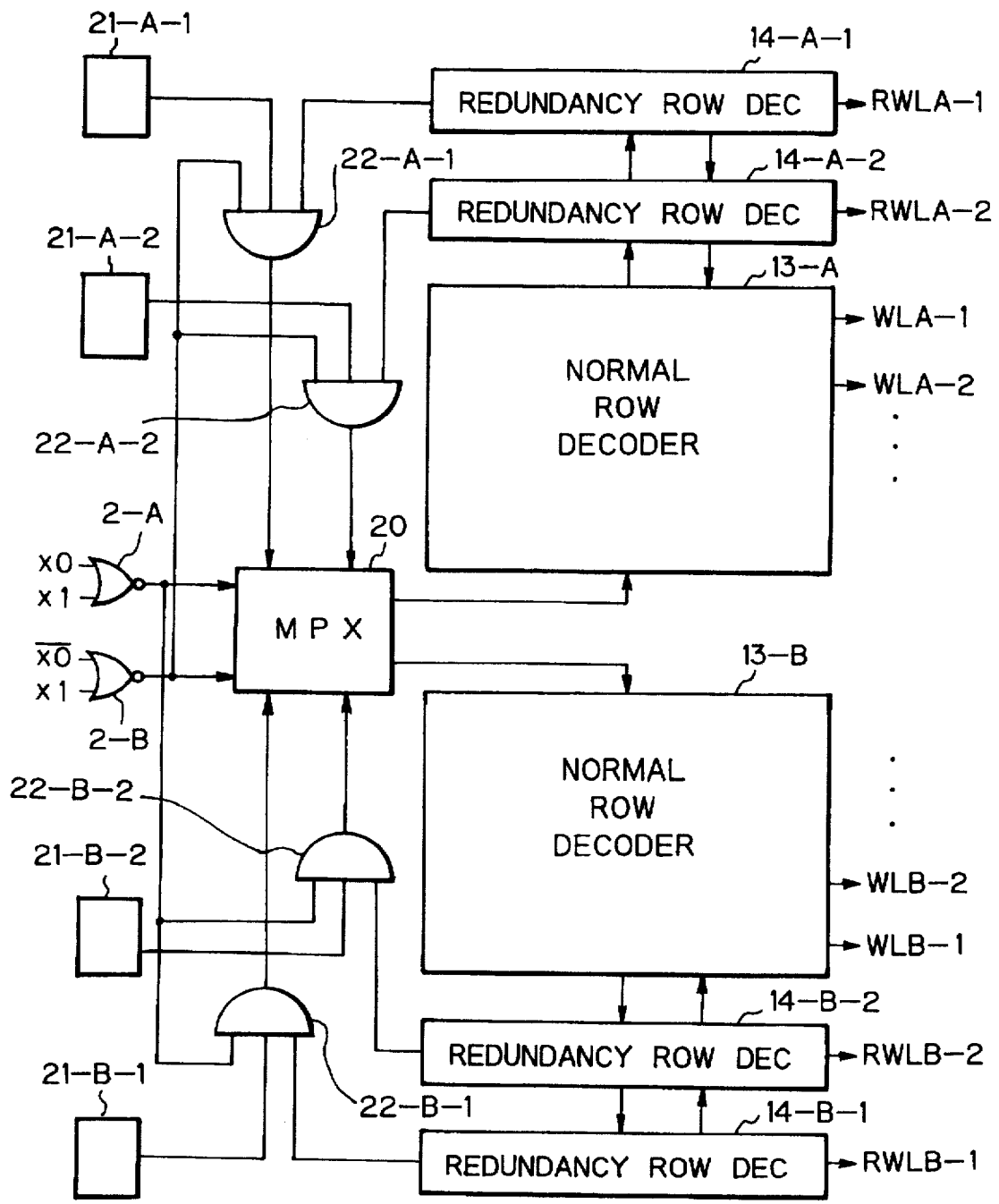
FIG. 5 is a circuit diagram illustrating a modification of the circuit of FIG. 4.

In FIG. 5, which illustrates a modification of the circuit of FIG. 4, two redundancy memory cell rows are allocated to each of the blocks. In this case, two redundancy row decoders 14-A-1 and 14-A-2, two redundancy memory cell row exchanging circuits 21-A-1 and 21-A-2, and AND circuits 22-A-1 and 22-A-2=are provided for the block 1-A. Also, two redundancy row decoders 14-B-1 and 14-B-2, two redundancy memory cell row exchanging circuits 21-B-1 and 21-B-2, and AND circuits 22-B-1 and 22-B-2 are provided for the block 1-B. Note that the output signals of the four AND circuits 22-A-1, 22-A-2, 22-B-1 and 22-B-2 are supplied to a NOR circuit 205 of FIG. 4.

Thus, in FIG. 5, four word lines of the block 1-A can be replaced by the redundancy word lines RWLA-1 RWLA-2 of the block 1-A as well as the redundancy word lines RWLB-1 and RWLB-2 of the block 1-B. Similarly, four word lines of the block 1-B can be replaced by the redundancy word lines RWLB-1 RWLB-2 of the block 1-B as well as the redundancy word lines RWLA-1 and RWLA-2 of the block 1-A.

Also, the present invention can be applied to a semiconductor memory device including a plurality of blocks each having one or two redundancy memory cell columns. Further, the present invention can be applied to a semiconductor memory device including a plurality of blocks each having three or more redundancy memory cell rows or columns.

As explained hereinabove, according to the present invention since word lines of one block connected to defective memory cells are replaced by redundancy word lines of other blocks, the number of redundancy word lines and the number of redundancy memory cells can be reduced, thus increasing the manufacturing yield.

I claim:

1. A semiconductor memory device comprising:
   a first memory cell block means having a first normal memory cell array and at least one first redundancy memory cell row;
   a second memory cell block means having a second normal memory cell array and at least one second redundancy memory cell row;
   first and second memory cell block selecting circuits for selecting said first and second memory cell block means;
   a multiplexer, connected between said first and second memory cell block selecting circuits and said first and second memory cell block means, said multiplexer being in a first state where said first and second memory cell block selecting circuits select said first and second memory cell block means, respectively, said multiplexer being in a second state where said first and second memory cell block selecting circuits select said second and first memory cell block means, respectively;
   first and second redundancy memory cell row exchanging circuits;
   a first logic circuit, connected to said first redundancy memory cell row exchanging circuit, said first memory cell block means, said second memory cell block selecting circuit and said multiplexer, for generating a first control signal to put said multiplexer in said second state when said first redundancy memory cell row exchanging circuit generates a first exchange signal, said second memory cell block selecting circuit is activated, and said first redundancy memory cell row is selected; and
   a second logic circuit, connected to said second redundancy memory cell row exchanging circuit, said second memory cell block means, said first memory cell block selecting circuit and said multiplexer, for generating a second control signal to put said multiplexer in said second state when said second redundancy memory cell row exchanging circuit generates a second exchange signal, said first memory cell block selecting circuit is activated, and said second redundancy memory cell row is selected,
   said multiplexer being in said first state when none of said first and second control signals are generated.

2. The device as set forth in claim 1, wherein each of said first and second redundancy memory cell row exchanging circuits comprises:
   a resistor connected to a first power supply terminal; and
   a fuse connected between said resistor and a second power supply terminal.

3. The device as set forth in claim 1, wherein each of said first and second logic circuits comprises an AND circuit.

4. A semiconductor memory device comprising:
   a first memory cell block having a first normal memory cell array and at least one firs redundancy memory cell row;
   a second memory cell block having a second normal memory cell array and at least one second redundancy memory cell row;
   a first normal decoder, connected to said first normal memory cell array, for selecting one row of said first normal memory cell array;
   a first redundancy decoder, connected to said first redundancy memory cell row, for selecting said first redundancy memory cell row;
   a second normal decoder, connected to said second normal memory cell array, for selecting one row of said second normal memory cell array;
   a second redundancy decoder, connected to said second redundancy memory cell row, for selecting said second redundancy memory cell row;
   first and second memory cell block selecting circuits for selecting said first and second memory cell blocks;
   a multiplexer, connected between said first and second memory cell block selecting circuits, said first and second normal decoders, and said first and second redundancy decoders, said multiplexer being in a first state where said first and second memory cell block selecting circuits select said first and second normal decoders, respectively, and select said first and second redundancy decoders, respectively, said multiplexer being in a second state where said first and second memory cell block selecting circuits select said second and first normal decoders, respectively, and select said second and first redundancy decoders, respectively;
   first and second redundancy memory cell row exchanging circuits;
   a first logic circuit, connected to said first redundancy memory cell row exchanging circuit, said first redundancy decoder, said second memory cell block selecting circuit and said multiplexer, for generating a first control signal to put said multiplexer in said second state when said first redundancy memory cell row exchanging circuit generates a first exchange signal, said second memory cell block selecting circuit is activated, and said first redundancy decoder is activated; and
   a second logic circuit, connected to said second redundancy memory cell row exchanging circuit, said second redundancy decoder, said first memory cell block selecting circuit and said multiplexer, for generating a second control signal to put said multiplexer in said second state when said second redundancy memory cell row exchanging circuit generates a second exchange signal, said first memory cell block selecting circuit is activated, and said second redundancy decoder is activated,
   said multiplexer being in said first state when none of said first and second control signals are generated.

5. The device as set forth in claim 4, wherein each of said first and second redundancy memory cell row exchanging circuits comprises:

a resistor connected to a first power supply terminal; and a fuse connected between said resistor and a second power supply terminal.

6. The device as set forth in claim 4, wherein each of said first and second logic circuits comprises an AND circuit.

7. A semiconductor memory device comprising:

a first memory cell block having a first normal memory cell array and at least one first redundancy memory cell array;

a second memory cell block having a second normal memory cell array and at least one second redundancy memory cell array;

first and second memory cell block selecting circuits for selecting said first and second memory cell blocks;

a multiplexer, connected between said first and second memory cell block selecting circuits and said first and second memory cell blocks, said multiplexer being in a first state where said first and second memory cell block selecting circuits select said first and second memory cell blocks, respectively, said multiplexer being in a second state where said first and second memory cell block selecting circuits select said second and first memory cell block, respectively;

first and second redundancy memory cell array exchanging circuits;

a first logic circuit, connected to said first redundancy memory cell array exchanging circuit, said first memory cell block, said second memory cell block selecting circuit and said multiplexer, for generating a first control signal to put said multiplexer in said second state when said first redundancy memory cell array exchanging circuit generates a first exchange signal, said second memory cell block selecting circuit is activated, and said first redundancy memory cell array is selected; and a second logic circuit, connected to said second redundancy memory cell array exchanging circuit, said second memory cell block, said first memory cell block selecting circuit and said multiplexer, for generating a second control signal to put said multiplexer in said second state when said second redundancy memory cell array exchanging circuit generates a second exchange signal, said first memory cell block selecting circuit is activated, and said second redundancy memory cell array is selected, said multiplexer being in said first state when none of said first and second control signals are generated.

8. The device as set forth in claim 7, wherein each of said first and second redundancy memory cell array exchanging circuits comprises:

a resistor connected to a first power supply terminal; and a fuse connected between said resistor and a second power supply terminal.

9. The device as set forth in claim 7, wherein each of said first and second logic circuits comprises an AND circuit.

* * * * *